United States Patent [19]

Han et al.

[11] 4,407,696

[45] Oct. 4, 1983

[54] FABRICATION OF ISOLATION OXIDATION FOR MOS CIRCUIT

[75] Inventors: Yu-Pin Han, Dallas; Bing C. Ma, Carrollton, both of Tex.

[73] Assignee: Mostek Corporation, Carrollton, Tex.

[21] Appl. No.: 453,214

[22] Filed: Dec. 27, 1982

[51] Int. Cl.³ .................. B44C 1/22; C03C 15/00; C03C 25/06; H01L 21/306
[52] U.S. Cl. .................. 156/653; 29/576 W; 156/657; 156/659.1; 156/662; 357/49; 427/93
[58] Field of Search .................. 427/93; 357/49, 50, 357/53, 54; 29/576 W, 571, 580; 156/648, 653, 657, 659.1, 662; 430/313, 317

[56] References Cited

U.S. PATENT DOCUMENTS

| | | | |
|---|---|---|---|
| 3,958,040 | 5/1976 | Webb | 427/94 |
| 4,016,007 | 4/1977 | Wada et al. | 427/93 X |
| 4,053,349 | 10/1977 | Simko | 156/653 X |
| 4,181,537 | 1/1980 | Ichinohe | 427/93 X |

Primary Examiner—William A. Powell

[57] ABSTRACT

A method is disclosed for fabricating an isolation oxidation (44), also referred to as field oxide, to separate the active regions on the surface of an MOS integrated circuit. On the surface of a semiconductor substrate (24) there are fabricated in successive layers an oxide layer (26), a polysilicon layer (28) and a nitride layer (30). A patterned resist layer (32) is formed on the surface of the nitride layer (30). The nitride layer (30) is etched through an opening (34) in the resist layer (32), which is then removed. The isolation oxidation (44) is then grown through an opening (36) in the nitride layer (30). The isolation oxidation (44) comprises oxide derived from the oxide layer (26) and from oxide produced from the polysilicon layer (28) and the semiconductor substrate (24). Next, the nitride layer (30), the polysilicon layer (28) and the oxide layer (26) are etched. The resulting isolation oxidation (44) has a bird's-beak area (46) which is less than 50% of the width of a bird'-beak area (14) produced using conventional MOS manufacturing processes.

5 Claims, 4 Drawing Figures

FABRICATION OF ISOLATION OXIDATION FOR MOS CIRCUIT

TECHNICAL FIELD

The present application pertains in general to integrated circuits and more particularly to the fabrication of isolation oxidation in the manufacture of MOS (metal oxide semiconductor) circuits.

BACKGROUND OF THE INVENTION

A continuing objective in the manufacture of integrated circuits is to reduce the dimensions of the circuit elements to produce the highest possible density. In the manufacture of MOS integrated circuits it is the usual practice to separate active areas of the semiconductor by use of isolation oxidation which is also referred to as field oxide. In the conventional method of fabricating the isolation oxidation, a 1,000 angstrom thick pad oxide is fabricated on the surface of a semiconductor substrate with a 1,000 angstrom thick nitride layer fabricated over the pad oxide. The nitride layer is etched to expose an open area and the isolation oxidation is grown in this area. This manufacturing process yields a minimum of oxidation induced defects but produces a long sloping edge structure which is referred to as the "bird's-beak" area. There is typically a 1:1 ratio between the length of the bird's-beak area and the thickness of the isolation oxidation. The bird's-beak area expands the width of the isolation oxidation which substantially limits the minimum dimension which can be produced for the isolation oxidation.

In view of the above problem regarding the bird's-beak area produced in the conventional fabrication of isolation oxidation in MOS circuits, there exists a need for a manufacturing process for the production of isolation oxidation with a much shortened bird's-beak area to reduce the dimensions of MOS elements.

SUMMARY OF THE INVENTION

A selected embodiment of the present invention comprises a method for fabricating isolation oxidation on a semiconductor substrate. In a first step of the method there is produced a first oxide layer on the surface of the substrate. A polysilicon layer is then fabricated on the surface of the first oxide layer. Next, there is produced a nitride layer on the surface of the polysilicon layer. The nitride layer is then etched to open an area for the formation of the isolation oxidation. The isolation oxidation is then produced essentially in the opened area as a layer which comprises the first oxide layer, oxide derived from the polysilicon layer and oxide derived from the semiconductor substrate. Last, there is an etching of the nitride layer, the polysilicon layer and the first oxide layer from at least the edges of the isolation oxidation. In the resulting isolation oxidation, the bird's-beak areas are substantially shorter than have heretofore been produced.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
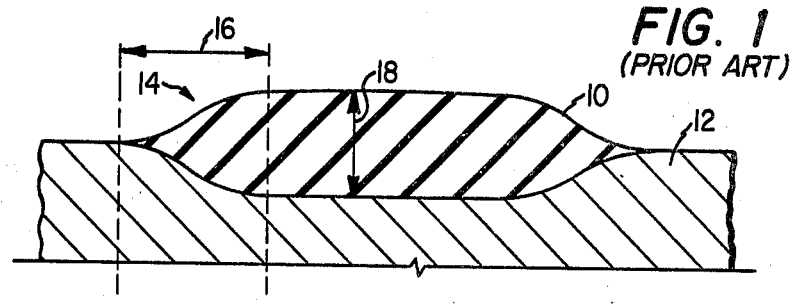
FIG. 1 is a sectional elevation view showing isolation oxidation as it has heretofore been produced using prior art techniques.

Referring now to FIG. 1, there is shown a section view of isolation oxidation as it is produced utilizing conventional fabrication processes. Isolation oxidation 10 is fabricated on a semiconductor substrate 12. Preferably, the substrate 12 is silicon (Si) and the oxidation isolation is silicon dioxide ($SiO_2$). As noted above, the isolation oxidation 10 is conventionally produced by fabricating a pad oxide immediately on the substrate 12 covered by a nitride layer over the pad oxide. The nitride layer is then etched to open an area in which the isolation oxidation 10 is then produced.

As a result of the above fabrication process, there is produced an area 14 which is referred to as the "bird's-beak". The surface of the area 14 has a relatively small slope which results in a relatively wide transition area between the maximum thickness of the isolation oxidation 10 and the extreme edge of the oxidation. The length of the bird's-beak area 14 is shown by the line 16. The thickness of the oxidation 10 is shown by the line 18. The typical ratio of the length of the bird's-beak area to the thickness of the oxidation 10 is 1:1. This wide bird's-beak area substantially increases the minimum dimension which can be fabricated for the oxidation 10.

Figure 2:
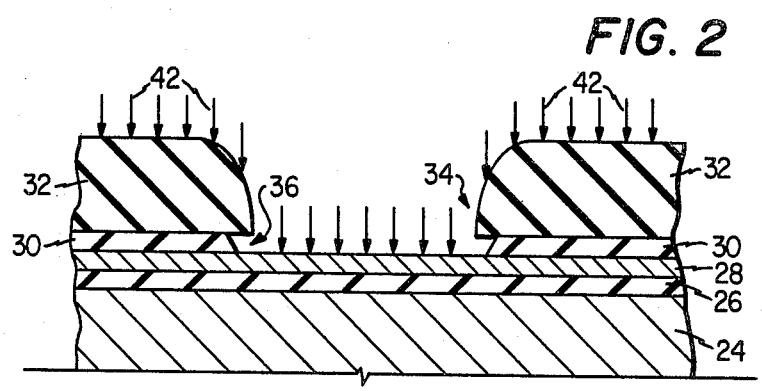
FIG. 2 is a sectional elevation view showing the various layers which are fabricated on a semiconductor substrate in accordance with the present invention.
Figure 3:
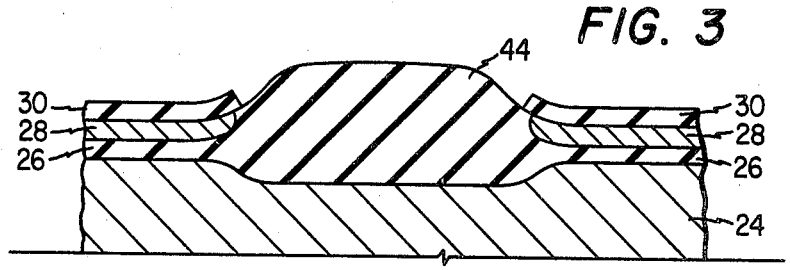
FIG. 3 is a sectional elevation view showing the production of isolation oxidation in accordance with the method of the present invention.
Figure 4:
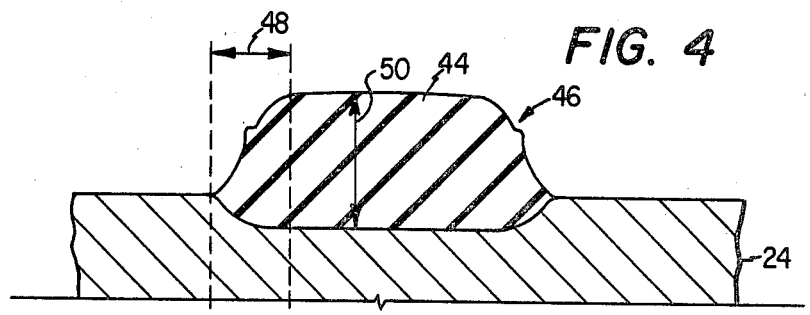
FIG. 4 is a sectional elevation view showing the final isolation oxidation produced following the method of the present invention and further illustrating the reduced geometries resulting from the smaller length of the bird's-beak area.

The method of the present invention for fabricating isolation oxidation is illustrated in FIGS. 2, 3 and 4. Referring now to FIG. 2 there is shown a silicon semiconductor substrate 24 which has an oxide layer 26 fabricated on the surface thereof. A polysilicon layer 28 is fabricated immediately on the surface of the oxide layer 26. A nitride ($Si_3N_4$) layer 30 is fabricated on the surface of the polysilicon layer 28. A patterned resist layer 32 is fabricated on the surface of the nitride layer 30 and includes an opening 34. A nitride etch is applied through the opening 34 to etch the nitride layer 30 and produce an opening 36 therein. The openings 34 and 36 define the area in which the isolation oxidation is to be produced.

In the overall production of an MOS integrated circuit, there can be applied at this stage of fabrication an ion implant which is represented by the arrows 42. The ions are projected with an energy which is sufficient to penetrate the oxide layer 26 and polysilicon layer 28, and pass into the substrate 24. The ions have insufficient energy to pentrate through the combination of the resist layer 32, nitride layer 30, polysilicon layer 28 and oxide layer 26. Therefore, the implantation is applied only to the area exposed by the opening 34.

In the preferred embodiment of the present invention the oxide layer 26 is approximately 250–500 angstroms thick, the polysilicon layer 28 is approximately 1,500–2,000 angstroms thick and the nitride layer 30 is approximately 1,000 angstroms thick.

Further processing steps in accordance with the method of the present invention are illustrated in FIG.

3. The resist layer 32 has been removed and an isolation oxidation 44 has been produced by growing oxide in a steam environment. The oxidation 44 is preferably grown to be approximately 8,000–10,000 angstroms thick. The oxidation layer 44 includes the oxide layer 26 and includes oxide which is derived from the polysilicon layer 28. The remainder of the oxide making up the isolation oxidation 44 is derived from the semiconductor substrate 24. Note that the growth of the isolation oxidation 44 tends to bend the edges of the layers 28 and 30 upward. A portion of the polysilicon layer 28 is consumed laterally in the process of producing the isolation oxidation 44.

In the next steps of the process, the nitride layer 30 is etched, the polysilicon layer 28 is etched and the oxide layer 26 is etched to remove these layers from at least the edges of the isolation oxidation 44. The resulting isolation oxidation 44 on substrate 24 is illustrated in FIG. 4. The production of the isolation oxidation 44 results in the formation of a bird's-beak area 46. The length of area 46 is shown by a line 48. The thickness of the oxidation 44 is shown by a line 50. Note that the surface of the bird's-beak area 46 has a much steeper slope, and shorter length, than the bird's-beak area 14 shown in FIG. 1. This can be seen by the ratio of the length of the bird's-beak area to the thickness of the oxidation 44. This ratio is approximately 0.5:1. There is thus a reduction in the length of the bird's-beak area of approximately 50% or more. This substantially reduces the overall minimum dimension of the isolation oxidation 44, which in turn leads to reduced dimension sizes for the elements of integrated circuits produced with the method of the present invention.

The length of the bird's-beak area is reduced with the method of the present invention as a result of a number of physical processes. There is essentially no bird's-beak area formed at the interface of the nitride layer 30 and the polysilicon layer 28 due to the even lateral oxidation of the polysilicon layer 28. The bird's-beak area formed at the interface of the polysilicon layer 28 and the oxide layer 26 is reduced because the laterally diffused oxidant is partially absorbed by the vertical edge of the polysilicon layer 28 and the remaining oxidant is absorbed by the parallel surface of the polysilicon layer 28 and the surface of the substrate semiconductor.

In summary, the present invention comprises a method for fabricating the isolation oxidation which serves to separate the active regions in an MOS integrated circuit. Thet method produces a bird's-beak area which is substantially shorter than that produced with prior art fabrication processes. This in turn leads to reduced dimensions and greater component density for an integrated circuit.

We claim:

1. A method for fabricating isolation oxidation on a silicon semiconductor substrate, comprising the steps of:

producing a first oxide layer on the surface of said substrate, producing a polysilicon layer on the surface of said first oxide layer, producing a nitride layer on the surface of said polysilicon layer, etching said nitride layer to open an area therein, producing said isolation oxidation as a layer located in the region of the open area of said nitride layer, said isolation oxidation layer comprising said first oxide layer, oxide derived from said polysilicon layer and oxide derived from said semiconductor substrate, and etching said nitride layer, said polysilicon layer and said first oxide layer from at least the edges of said isolation oxidation layer.

2. A method for fabrication isolation oxidation as recited in claim 1, wherein the thickness of said first oxide layer is in the range of 250–500 angstroms, the thickness of said polysilicon layer is in the range of 1,500–2,000 angstroms and the thickness of said nitride layer is in the range of 800 to 1,000 angstroms.

3. A method for fabricating an isolation oxidation as recited in claim 1, wherein the step of etching said nitride layer comprises the steps of:

applying a patterned resist layer over said nitride layer, said resist layer having an opening therein, and etching said nitride layer through said opening to produce said open area in said nitride layer.

4. A method for fabricating an isolation oxidation as recited in claim 1, including the step of introducing an impurity into said polysilicon layer to enhance the oxidation thereof during the producing of said isolation oxidation.

5. A method for fabricating isolation oxidation on a silicon semiconductor substrate, comprising the steps of:

growing a first oxide layer on the surface of said substrate, depositing a polysilicon layer on the surface of said oxide layer, depositing a nitride layer on the surface of said polysilicon layer, applying a patterned photo resist layer on the surface of said nitride layer, said photo resist layer having an opening therein, etching said nitride layer through said opening in said resist layer to open an area in said nitride layer, growing said oxidation isolation as a layer located in the region of the open area of said nitride layer, said isolation oxidation layer comprising the portion of said first oxide layer beneath said area in said nitride layer, oxide derived from said polysilicon layer beneath said area in said nitride layer, and oxide derived from said substrate beneath said area of said nitride layer, and etching the remaining portion of said nitride layer, said polysilicon layer and said first oxide layer from said semiconductor substrate.

* * * * *